United States Patent
Hsiao

(10) Patent No.: US 6,277,725 B1
(45) Date of Patent: Aug. 21, 2001

(54) METHOD FOR FABRICATING PASSIVATION LAYER ON METAL PAD

(75) Inventor: Chih-Hsiang Hsiao, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/348,396

(22) Filed: Jul. 7, 1999

(51) Int. Cl.[7] .................. H01L 21/44; H01L 21/461; H01L 21/31

(52) U.S. Cl. .................. 438/612; 438/613; 438/624; 438/756; 438/751; 438/757; 438/759

(58) Field of Search .................. 438/38, 612, 624, 438/613–617, 723–724, 743–744, 745, 759, 751, 757, 778, 787, 791, 958

(56) References Cited

U.S. PATENT DOCUMENTS

| | | | |
|---|---|---|---|
| 5,792,705 | * | 8/1998 | Wang et al. .................. 438/624 |
| 5,851,603 | * | 12/1998 | Tsai et al. .................. 427/579 |
| 6,030,881 | * | 2/2000 | Papasouliotis et al. .................. 438/424 |

* cited by examiner

Primary Examiner—John F. Niebling
Assistant Examiner—Ha Tran Nguyen
(74) Attorney, Agent, or Firm—Thomas, Kayden, Horstemeyer & Risley, LLP

(57) ABSTRACT

A method for fabricating a passivation layer on a metal pad. A conformal first silicon dioxide layer is formed on a substrate having a metal pad. A conformal first silicon nitride layer is formed on the first silicon dioxide layer, and then a second silicon dioxide layer is formed on the first silicon nitride layer by high density plasma chemical vapor deposition. The second silicon dioxide layer is planarized to expose the first silicon nitride layer. A portion of the first silicon nitride layer aligned over the metal pad is removed to expose the first silicon dioxide layer. A second silicon nitride layer is formed to cover the first silicon dioxide layer and the second silicon dioxide layer. In the above process, a thickness of the first silicon dioxide layer and a thickness of the second silicon nitride layer are precisely controlled.

16 Claims, 2 Drawing Sheets

METHOD FOR FABRICATING PASSIVATION LAYER ON METAL PAD

BACKGROUND OF THE INVENTION

1. Field of Invention

The present invention relates to a method for fabricating a passivation layer on a metal pad. More particularly, the present invention relates to a method for fabricating a passivation layer on a metal pad in which the passivation layer protects the metal pad from damage.

2. Description of Related Art

In a conventional semiconductor manufacturing process metal pads are formed on a substrate; some metal pads are for wire bonding and others serve as a high reflectance material layer. After the metal pads are formed, a first silicon dioxide layer serving as a passivation layer is formed by high density plasma chemical vapor deposition to cover the metal pads, and a thickness of the first silicon dioxide layer is 5000 to 15000 Å. A chemical mechanical polishing process is performed to reduce the thickness of the first silicon dioxide layer. After the chemical mechanical polishing process, the thickness of the first silicon dioxide layer is 1500 to 2000 Å. Then, a portion of the first silicon dioxide layer is removed by dry etching to expose the metal pads, so that the residual first silicon dioxide layer remains only between the metal pads. A second silicon dioxide layer whose thickness is controlled precisely and a silicon nitride layer are formed in sequence over the substrate. After light passes through the second silicon dioxide layer and the silicon nitride layer, and is reflected from the metal pads serving as the high reflectance material layer, constructive interference is produced.

In the above process, a dishing effect occurs after the chemical mechanical polishing process and the first silicon dioxide layer is excessively removed during the dry etching process. As a result, the planarity of the semiconductor is poor. Furthermore, the surface of each of the metal pads is damaged during the dry etching process, so that reflectance of each of the metal pads is reduced.

SUMMARY OF THE INVENTION

The invention provides a method for fabricating a passivation layer on a metal pad in which the passivation layer protects the metal pad from damage.

As embodied and broadly described herein, the invention provides a method for fabricating a passivation layer on a metal pad. A conformal first silicon dioxide layer is formed on a substrate having a metal pad. A conformal first silicon nitride layer is formed on the first silicon dioxide layer, and then a second silicon dioxide layer is formed on the first silicon nitride layer by high density plasma chemical vapor deposition. The second silicon dioxide layer is planarized to expose the first silicon nitride layer. A portion of the first silicon nitride layer aligned over the metal pad is removed to expose the first silicon dioxide layer. A second silicon nitride layer is formed to cover the first silicon dioxide layer and the second silicon dioxide layer. In the above process, a thickness of the first silicon dioxide layer and a thickness of the second silicon nitride layer should be controlled precisely.

In the invention, the first silicon dioxide layer covers the metal pad, so that the surface of the metal pad is not damaged during the process. Therefore, reflectance of the metal pad is maintained. Additionally, constructive interference is produced after light passes through the first silicon dioxide layer and the second silicon nitride layer and is reflected from the metal pad because the thicknesses of the first silicon dioxide layer and the second silicon dioxide layer are controlled precisely. By controlling the thickness of the first silicon nitride layer and the chemical mechanical polishing process, the surface composed of the first silicon dioxide layer and the second silicon dioxide layer is planar.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 1A through 1E are schematic, cross-sectional diagrams illustrating a method for fabricating a passivation layer on a metal pad according to the invention.

Figure 1A:
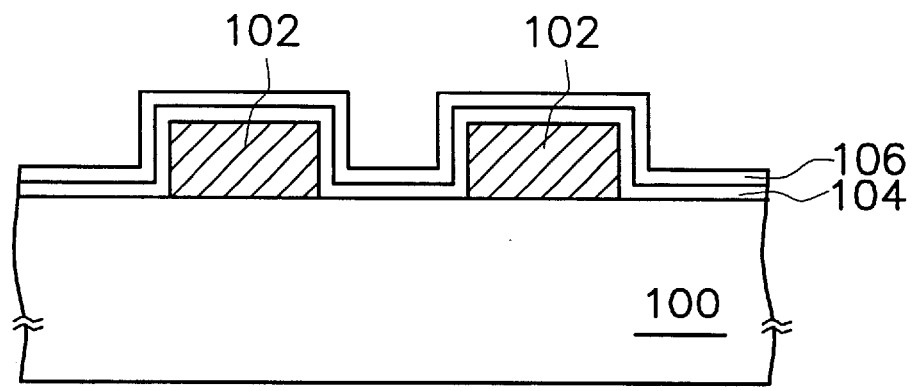
FIGS. 1A through 1E are schematic, cross-sectional diagrams illustrating a method for fabricating a passivation layer on a metal pad according to the invention.

Referring to FIG. 1A, a substrate 100 having devices (not shown) is provided. A metal pad 102 is formed on the substrate 100. Metal pads formed on the substrate have two applications: either for wire bonding or as a high reflectance material layer. Even though the metal pads have different uses, they are formed in the same process. In this embodiment, the metal pad 102 is used as a high reflectance material layer.

A conformal silicon dioxide layer 104 serving as a passivation layer and a silicon nitride layer 106 are formed on the substrate 100 in sequence. A thickness of the silicon dioxide layer 104 is about 700 to 800 Å and the thickness of the silicon dioxide layer 104 should be controlled precisely; a thickness of the silicon nitride layer 106 is about 500 to 2000 Å.

Figure 1B:
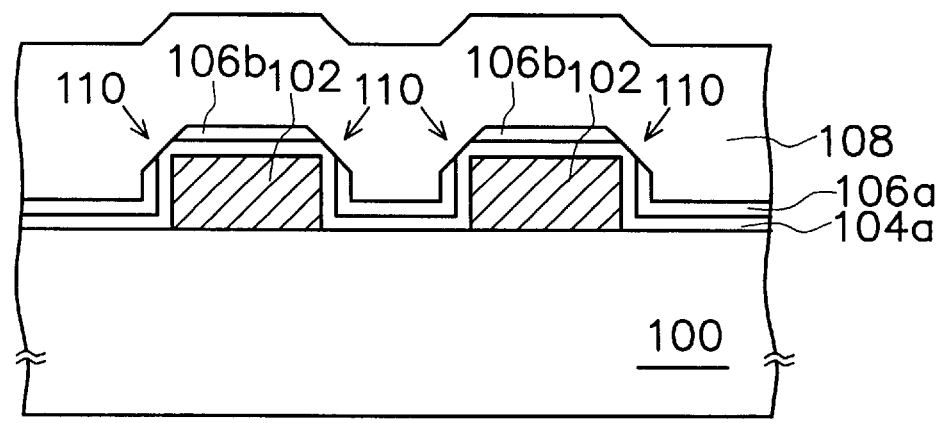

Referring to FIG. 1B, a silicon dioxide layer 108 is formed over the substrate 100 by, for example, high density plasma chemical vapor deposition. Since an etching process and a depositing process are performed simultaneously during the high density plasma chemical vapor deposition process, a portion of the silicon nitride layer 106 and a portion of the silicon dioxide layer 104, which are at a corner 110 of the metal pad 102, are removed while forming the silicon dioxide layer 108. Therefore, silicon nitride layer 106a, 106b and a silicon dioxide layer 104a are formed, wherein at the corner 110 of the metal pad 102, the silicon dixoxide layer 104a is directly in contact with the silicon dioxide layer 108. The silicon nitride layer 106b is on top of the metal pad 102.

Figure 1C:
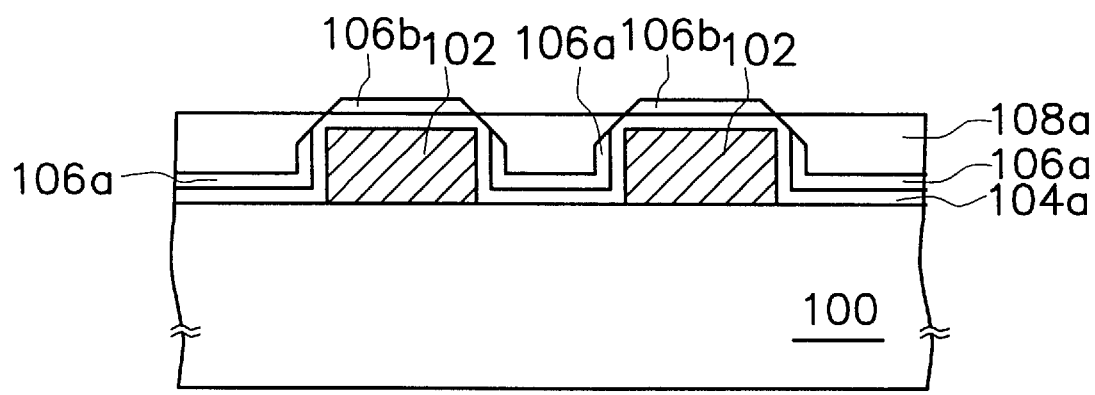

Referring to FIG. 1C, the silicon dioxide layer 108 is planarized to expose the silicon nitride layer 106b, and then a silicon dioxide layer 108a is formed. The planarization process is preferably chemical mechanical polishing. The silicon nitride layer 106a is still covered by the silicon dioxide layer 108a after the planarizing process.

Figure 1D:
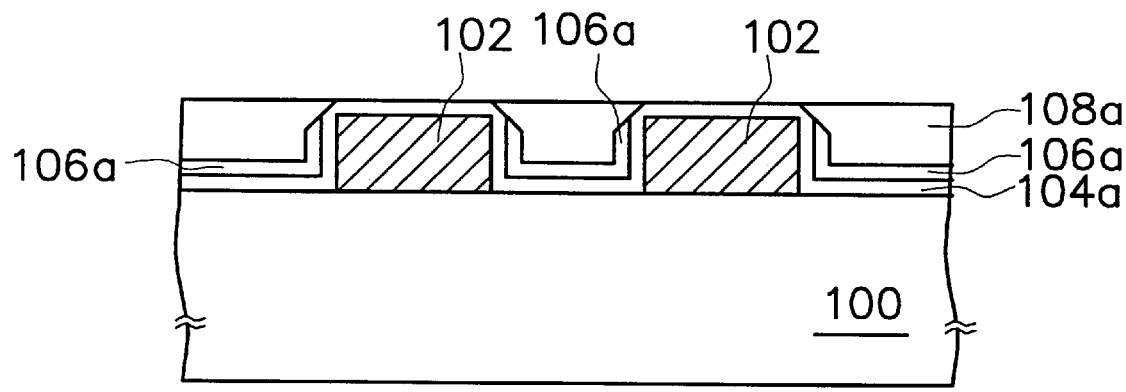

Referring to FIG. 1D, the silicon nitride layer 106b (FIG. 1C) is removed to expose the silicon dioxide layer 104a above the metal pad 102 by, for example, wet etching. An etchant used to perform the wet etching process is preferably hot phosphoric acid. When the silicon nitride layer 106b is removed by wet etching, the silicon dioxide layer 104a is not etched because the silicon dioxide layer 104a is covered by the silicon nitride layer 106a and the silicon dioxide layer 108a. Furthermore, since the silicon nitride layer 106a is covered by the silicon dioxide layer 108a without being contact with the silicon nitride layer 106b, the silicon nitride layer 106a is not simultaneously removed with the removal of the silicon nitride layer 106b by the wet etching process.

By controlling the thickness of the silicon nitride layer 106 (FIG. 1) and the chemical mechanical polishing process, the entire surface composed of the silicon dioxide layer 104a and the silicon dioxide layer 108a can be formed planar.

Figure 1E:
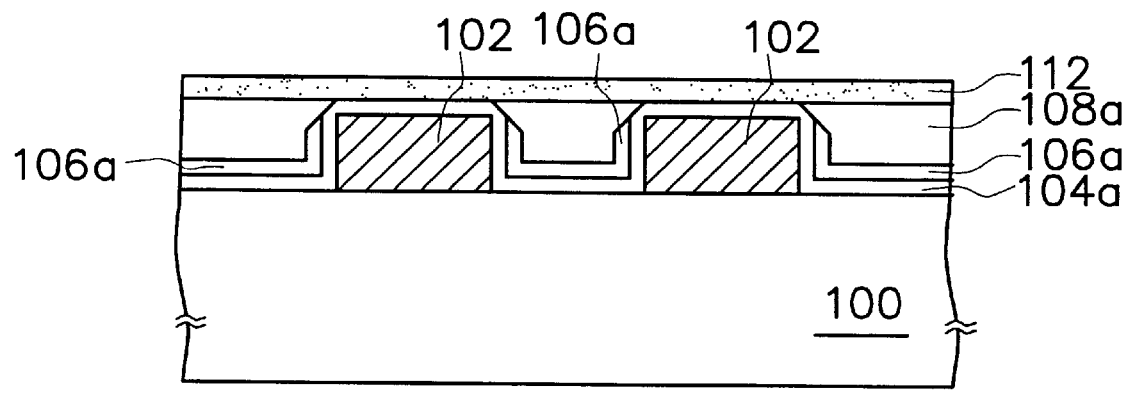

Referring to FIG. 1E, a silicon nitride layer 112 whose thickness is about 600 to 700 Å is formed to cover the silicon dioxide layers 104a, 108a. The thickness of the silicon nitride layer 112 should be also controlled precisely.

Since the silicon dioxide layer 104a covers the metal pad 102, the surface of the metal pad 102 is not damaged during the process, so that reflectance of the metal pad 102 is maintained. By controlling the thickness of the silicon dioxide layer 104 and the silicon nitride layer 112 precisely, constructive interference is produced after light passes through the silicon dioxide layer 104 and the silicon nitride layer 112, and is reflected from the metal pad 102.

According to the foregoing, the advantages of the invention include the following:

1. In the invention, the silicon dioxide layer covers the metal pad, so that the metal pad is not damaged during the manufacturing process. As a result, reflectance of the metal pad is maintained.

2. The surface of the semiconductor is planarized by controlling the thickness of the silicon nitride layer on the metal pad and the chemical mechanical polishing process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a passivation layer on a metal pad, comprising the steps of:
   providing a substrate having a metal pad;
   forming a conformal first silicon dioxide layer on the substrate;
   forming a conformal first silicon nitride layer on the first silicon di oxide layer;
   forming a second silicon dioxide layer on the first silicon nitride layer by high density plasma chemical vapor deposition;
   planarizing the second silicon dioxide layer to expose the first silicon nitride layer;
   removing only a portion of the first silicon nitride layer which is aligned over the metal pad to expose the first silicon dioxide layer; and
   forming a second silicon nitride layer to cover the first silicon dioxide layer and the second silicon dioxide layer.

2. The method of claim 1, wherein constructive interference is produced after light passes through the first silicon dioxide layer and the second silicon nitride layer, and is reflected from the metal pad.

3. The method of claim 1, wherein a thickness of the first silicon dioxide layer is about 700 to 800 Å.

4. The method of claim 1, wherein a thickness of the first silicon nitride layer is about 500 to 2000 Å.

5. The method of claim 1, wherein a thickness of the second silicon nitride layer is about 600 to 700 Å.

6. A method for fabricating a passivation layer on a metal pad, comprising the steps of:
   providing a substrate having a metal pad;
   forming a conformal first silicon dioxide layer and a conformal first silicon nitride layer on the substrate in sequence;
   forming a second silicon dioxide layer on the first silicon nitride layer, during which formation a portion of the first silicon nitride layer at top corners on the metal pad is removed;
   planarizing the second silicon dioxide layer to expose the first silicon nitride layer;
   removing only a portion of the conformal first silicon nitride layer which is aligned layer the metal pad to expose the first silicon dioxide layer; and
   forming a second silicon nitride layer to cover the first silicon dioxide layer and the second silicon dioxide layer.

7. The method of claim 6, wherein constructive interference is produced after light passes through the first silicon dioxide layer and the second silicon nitride layer, and is reflected from the metal pad.

8. The method of claim 6, wherein a thickness of the first silicon dioxide layer is about 700 to 800 Å.

9. The method of claim 6, wherein a thickness of the first silicon nitride layer is about 500 to 2000 Å.

10. The method of claim 6, wherein the step of forming the second silicon dioxide layer comprises high density plasma chemical vapor deposition.

11. The method of claim 6, wherein a thickness of the second silicon nitride layer is about 600 to 700 Å.

12. A method for fabricating a passivation layer on a metal pad, comprising the steps of:
    providing a substrate having a plurality of metal pads, wherein spaces are formed between the metal pads;
    forming a conformal first silicon oxide layer on the substrate, covering the metal pads;
    forming a conformal first silicon nitride layer on the first silicon oxide layer;
    forming a second silicon oxide layer on the first silicon nitride layer and filling the spaces between the metal pads, during which formation a portion of the first silicon nitride layer at top corners of the metal pads is removed;
    planarizing the second silicon oxide layer until the first silicon nitride layer aligned over the metal pads is exposed, wherein the first silicon nitride layer aligned along the sides of the metal pads is still concealed by the second silicon oxide layer;
    removing the first silicon nitride layer which is aligned over the metal pad to expose the first silicon oxide layer; and
    forming a second silicon nitride layer on a planar surface of the first silicon oxide layer and the second silicon oxide layer.

13. The method of claim 12, wherein a thickness of the first silicon oxide layer is about 700 angstroms to 800 angstroms thick.

14. The method of claim 12, wherein a thickness of the second silicon oxide layer is about 500 angstroms to about 2000 angstroms thick.

15. The method of claim 12, wherein a thickness of the second silicon nitride layer is about 600 angstroms to about 700 angstroms thick.

16. The method of claim 12, wherein forming the second silicon dioxide layer comprises performing high density plasma chemical vapor deposition.

* * * * *